United States Patent
Kuan et al.

(10) Patent No.: US 8,487,434 B2
(45) Date of Patent: *Jul. 16, 2013

(54) INTEGRATED CIRCUIT PACKAGE SYSTEM WITH REDISTRIBUTION LAYER AND METHOD FOR MANUFACTURING THEREOF

(75) Inventors: Heap Hoe Kuan, Singapore (SG); Seng Guan Chow, Singapore (SG); Rui Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 29 days.

This patent is subject to a terminal disclaimer.

(21) Appl. No.: 12/875,496

(22) Filed: Sep. 3, 2010

(65) Prior Publication Data

US 2010/0320603 A1   Dec. 23, 2010

Related U.S. Application Data

(63) Continuation of application No. 12/207,459, filed on Sep. 9, 2008, now Pat. No. 7,812,449.

(51) Int. Cl.
*H01L 23/48* (2006.01)
(52) U.S. Cl.
USPC ........... 257/738; 257/730; 257/777; 257/779; 257/780; 438/106; 438/107; 438/109; 438/114; 438/118

(58) Field of Classification Search
None
See application file for complete search history.

(56) References Cited

U.S. PATENT DOCUMENTS

| | | | |
|---|---|---|---|
| 6,072,239 A * | 6/2000 | Yoneda et al. | 257/730 |
| 6,372,539 B1 | 4/2002 | Bayan et al. | |
| 6,525,406 B1 | 2/2003 | Chung et al. | |
| 6,790,706 B2 | 9/2004 | Jeung et al. | |
| 6,841,874 B1 | 1/2005 | Paek et al. | |
| 6,987,319 B1 | 1/2006 | Paek et al. | |
| 7,002,239 B1 | 2/2006 | Nadarajah et al. | |
| 7,056,766 B2 | 6/2006 | Shiu et al. | |
| 7,342,318 B2 | 3/2008 | Huang et al. | |
| 7,361,531 B2 | 4/2008 | Sharma et al. | |
| 2002/0074637 A1* | 6/2002 | McFarland | 257/686 |
| 2004/0033673 A1* | 2/2004 | Cobbley et al. | 438/455 |
| 2004/0090759 A1* | 5/2004 | Kim | 361/790 |
| 2009/0001612 A1* | 1/2009 | Song et al. | 257/787 |
| 2010/0059884 A1 | 3/2010 | Kuan et al. | |

* cited by examiner

*Primary Examiner* — Kyoung Lee
(74) *Attorney, Agent, or Firm* — Ishimaru & Associates LLP; I-Chang John Yang

(57) ABSTRACT

A method for manufacturing an integrated circuit package system includes: providing a base device; attaching a base interconnect to the base device; applying an encapsulant over the base device and the base interconnect; and forming a re-routing film over the encapsulant, the base device, and the base interconnect for connectivity without a substrate.

16 Claims, 6 Drawing Sheets

INTEGRATED CIRCUIT PACKAGE SYSTEM WITH REDISTRIBUTION LAYER AND METHOD FOR MANUFACTURING THEREOF

CROSS-REFERENCE TO RELATED APPLICATION(S)

This is a continuation of U.S. patent application Ser. No. 12/207,459 filed Sep. 9, 2008, now U.S. Pat. No. 7,812,449.

TECHNICAL FIELD

The present invention relates generally to integrated circuit package systems and more particularly to a system for integrated circuit package with redistribution layer.

BACKGROUND ART

Virtually all aspects of modern life have been touched by integrated circuit semiconductor devices. From portable personal devices to industrial equipment, electronic devices improve processes and machines that we often take for granted.

The sometimes behind the scenes market for electronic devices increasingly demands more functions with faster response in reduced dimensions and at lower prices. These high performance devices often demand all of lighter, faster, smaller, multi-functional, highly reliable, and lower cost.

In efforts to meet such requirements, improvements have been attempted in many aspects of electronic product development such as producing smaller and less expensive semiconductor chips. Unfortunately, this development is still not enough to satisfy the demands.

A commonly used integrated circuit or semiconductor device methodology for packaging uses a substrate for the semiconductor chips. The substrate or "board" provides a connection pattern of input and output elements such as contacts, leads, or other electrodes. Typically, the chip is positioned on the substrate having an input/output electrode surface that is connected to an "active" surface of the chip.

In order to provide desired connection patterns, a substrate typically includes planar dielectrics, electrical contacts on the die-facing side of the substrate, conductive traces that extend laterally along the planar dielectrics, and contact pads, or "terminals," that are exposed at an opposite surface of the substrate. A substrate may also include conductive vias extending through a portion of the substrate thickness for interconnectivity.

Numerous technologies have been developed to meet these requirements. Some research and development focused on new package technologies while others focused on improving existing and mature package technologies. Research and development in package technologies may include a seemingly endless number of different approaches.

One proven way to reduce cost is to use package technologies with existing manufacturing methods and equipments. Paradoxically, the reuse of existing manufacturing processes does not typically result in the reduction of package size. Existing packaging technologies struggle to cost effectively meet demands of today's integrated circuit packages.

Of course, the requirement of additional material including the substrate undesirably increases the thickness and cost of fabricating the package. Moreover, the use of an additional substrate material may undesirably increase the manufacturing cycle time, which can also increase cost.

Despite the advantages of recent developments in semiconductor fabrication and packaging techniques, there is a continuing need for improving electronic device size, performance, reliability, and manufacturing.

Thus, a need still remains for an integrated circuit package system with improved manufacturing processes and materials.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit package system including: providing a base device; attaching a base interconnect to the base device; applying an encapsulant over the base device and the base interconnect; and forming a re-routing film over the encapsulant, the base device, and the base interconnect for connectivity without a substrate.

The present invention provides an integrated circuit package system including: a base device; a base interconnect connected to the base device; an encapsulant over the base device and the base interconnect; and a re-routing film over the encapsulant, the base device, and the base interconnect for connectivity without a substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
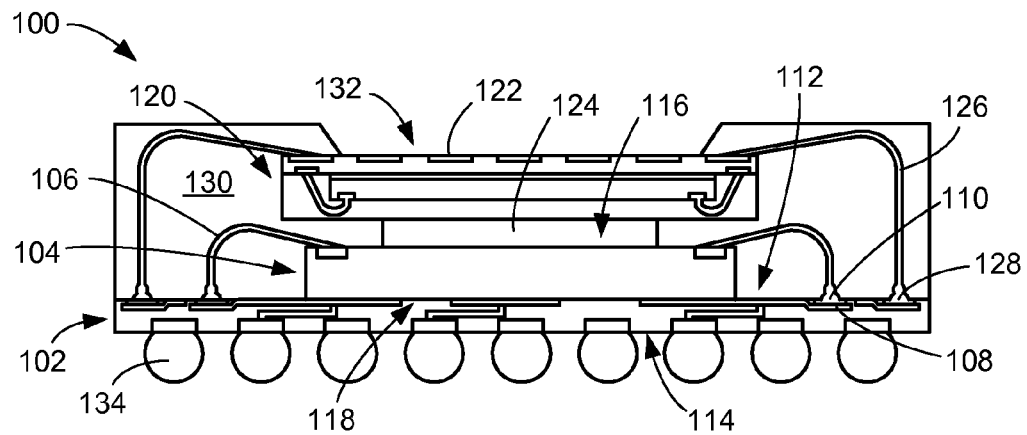
FIG. 1 is a cross-sectional view of an integrated circuit package system taken along line 1-1 of FIG. 3 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "upward", "downward", "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 3:
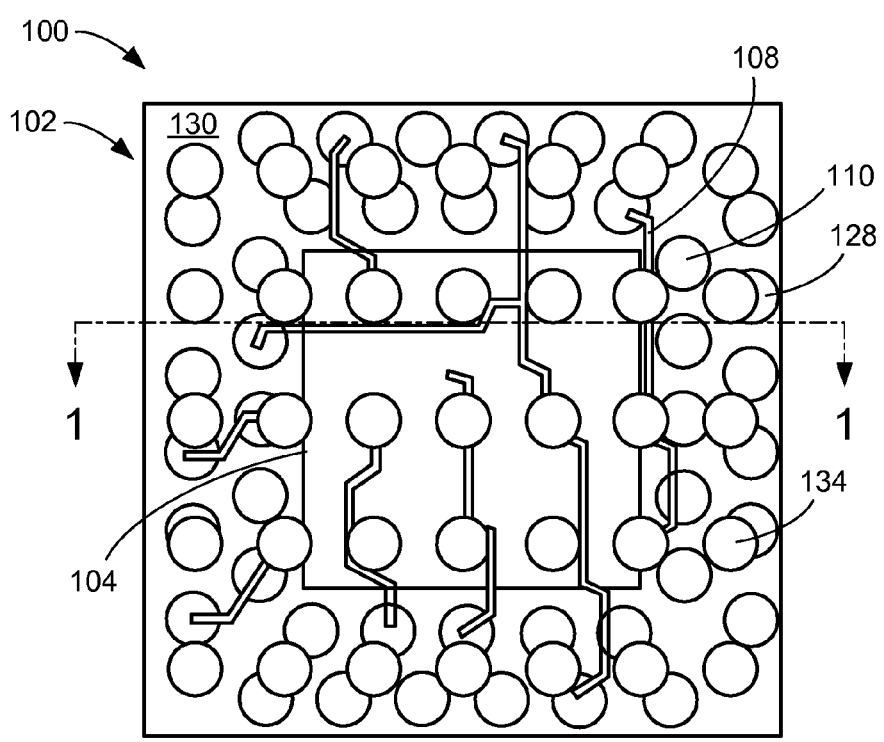
FIG. 3 is a bottom plan view of the integrated circuit package system.

Referring now to FIG. 1, therein is shown a cross-sectional view of an integrated circuit package system 100 taken along line 1-1 of FIG. 3 in a first embodiment of the present invention. The integrated circuit package system 100 preferably includes a redistribution network 102, a base device 104, and base interconnects 106.

The redistribution network 102 can be formed of one or more re-routing films 108 such as thin film conductors including integrated passive devices (IPD), or redistribution layers (RDL). The re-routing films 108 can be formed in a range of a few micrometers and provide an internal side 112 and an external side 114 of the redistribution network 102.

The base interconnects 106 such as wire bonds, planar interconnect, bumps, or any conductive material with any connection technology can include a base ball-end 110. The base ball-end 110 can be formed over the internal side 112 of the redistribution network 102 electrically connecting one of the re-routing films 108 to a base front side 116 of the base device 104.

For illustrative purposes, the base ball-end 110 is shown as a compressed or coined ball although it is understood that the base ball-end 110 can be formed differently. For example, the base ball-end 110 can be formed having a portion extending beyond a plane of a base back side 118 of the base device 104.

The base back side 118 can provide an attachment surface for the redistribution network 102. The base device 104 such as an integrated circuit die, an integrated circuit package, an internal stacking module, an interposer, or any other device can be attached over the redistribution network 102.

A stack device 120 such as an integrated circuit die, an integrated circuit package, an internal stacking module, an interposer, or any other device can be mounted over the base device 104. The stack device 120 having stack connectors 122 can be mounted with an attach layer 124 such as a silicon spacer, film, or wire in film material.

Stack interconnects 126 such as wire bonds, planar interconnect, bumps, or any conductive material with any connection technology can include a stack ball-end 128. The stack ball-end 128 can be formed over the internal side 112 of the redistribution network 102 electrically connecting one of the re-routing films 108 to the stack device 120.

An encapsulant 130 can cover and protect the stack interconnects 126, the stack device 120, the attach layer 124, the base interconnects 106, or the base device 104. The encapsulant 130 can optionally include an encapsulant cavity 132 such as fan-in cavity for a package on package or other component. The encapsulant cavity 132 can provide a portion of the stack device 120 including a portion of the stack connectors 122 substantially exposed.

Package connectors 134 can be formed on a side opposite the base device 104 over the external side 114 of the redistribution network 102. The package connectors 134 can provide electrical connectivity to a next level system such as another package, a printed circuit board, or any other component.

It has been unexpectedly discovered that the present invention having the redistribution network 102 provides improved package thickness resulting in a reduction of two tenths of a millimeter or more. The redistribution network 102 can replace a substrate (not shown) having a thickness of more than two tenths of a millimeter.

Figure 2:
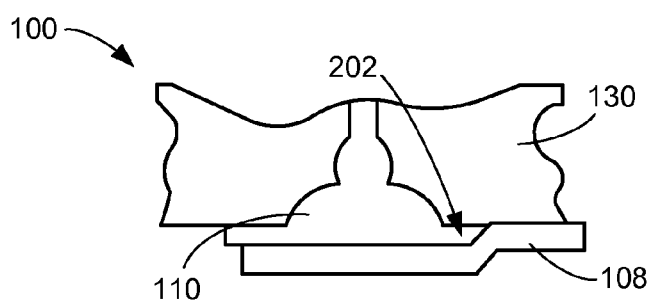
FIG. 2 is a detailed view of a portion of the structure of FIG. 1.

Referring now to FIG. 2, therein is shown a detailed view of a portion of the structure of FIG. 1. The base ball-end 110 is shown as a compressed or coined ball having a portion extending beyond a plane of the base back side 118 of FIG. 1.

The re-routing films 108 can include a re-routing recess 202 for the portion of the base ball-end 110 or the stack ball-end 128 extending beyond a plane of the base back side 118.

Referring now to FIG. 3, therein is shown a bottom plan view of the integrated circuit package system 100. The integrated circuit package system 100 preferably includes the package connectors 134, the base ball-end 110, the stack ball-end 128, the re-routing films 108, and the encapsulant 130.

The redistribution network 102 with the re-routing films 108 provides interconnection of the base device 104 of FIG. 1, the stack device 120 of FIG. 1, and a next level system without the need for a conventional substrate.

Figure 4:
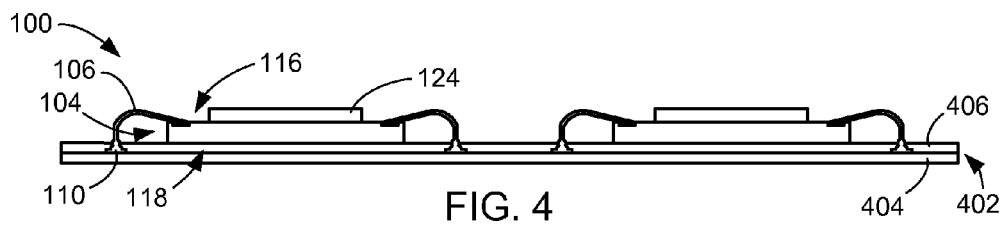
FIG. 4 is a cross-section view of the integrated circuit package system in a device attaching phase.

Referring now to FIG. 4, therein is shown a cross-section view of the integrated circuit package system 100 in a device attaching phase. The integrated circuit package system 100 preferably includes the base device 104 attached over a base provisional carrier 402 that can be removed during further processing.

Optionally the base provisional carrier 402 can be attached to a wafer (not shown). The wafer can be singulated such as by wafer saw. Expansion of the base provisional carrier 402 can provide spacing between one and another of the base device 104.

The base provisional carrier 402 includes a base support layer 404 and a base penetrable layer 406. The base interconnects 106 can be connected to the base front side 116 of the base device 104 and the base ball-end 110 can be over the base support layer 404 and embedded in the base penetrable layer 406.

The base ball-end 110 can be formed below the base back side 118 of the base device 104 on a side opposite the attach layer 124 applied over the base front side 116 for attaching another device.

For illustrative purposes, two of the base device 104 are shown although it is understood that any number of the base device 104 may be used. An array of the base device 104 can be formed during processing for volume manufacturing.

Figure 5:
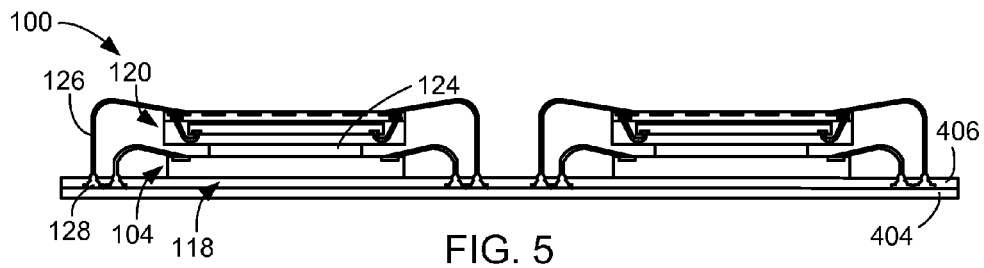
FIG. 5 is the structure of FIG. 4 in another device attaching phase.

Referring now to FIG. 5, therein is shown the structure of FIG. 4 in another device attaching phase. The integrated circuit package system 100 preferably includes the stack device 120 over the attach layer 124 and the base device 104.

The stack interconnects 126 can be connected to the stack device 120 and the stack ball-end 128 can be over the base support layer 404 and embedded in the base penetrable layer 406. The stack ball-end 128 can be formed below the base back side 118 of the base device 104.

Figure 6:
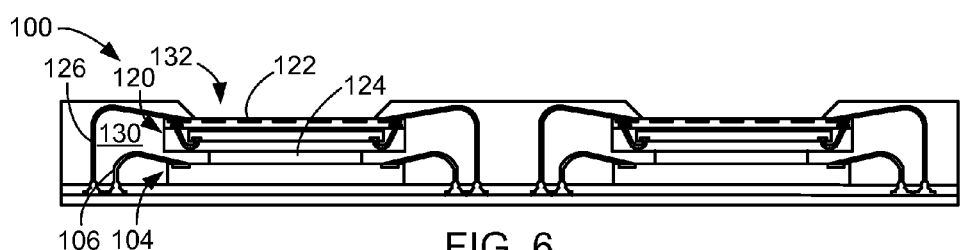
FIG. 6 is the structure of FIG. 5 in an encapsulation phase.

Referring now to FIG. 6, therein is shown the structure of FIG. 5 in an encapsulation phase. The integrated circuit package system 100 preferably includes the encapsulant 130 over the stack interconnects 126, the stack device 120, the attach layer 124, the base interconnects 106, and the base device 104.

The encapsulant 130 can optionally include the encapsulant cavity 132 providing a portion of the stack device 120 including a portion of the stack connectors 122 substantially exposed for a package on package or other component.

Figure 7:
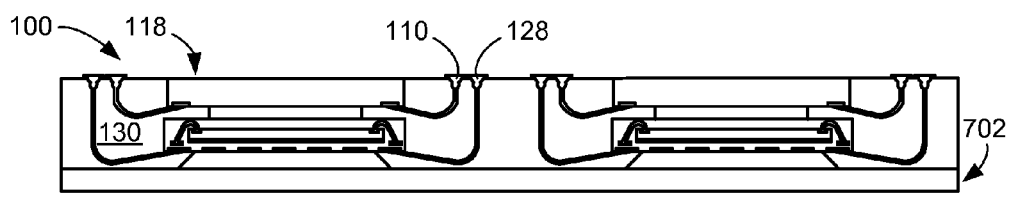
FIG. 7 is the structure of FIG. 6 in another carrier phase.

Referring now to FIG. 7, therein is shown the structure of FIG. 6 in another carrier phase. The integrated circuit package system 100 preferably includes a stack provisional carrier 702 over the encapsulation on a side opposite the base provisional carrier 402 of FIG. 4.

The stack provisional carrier 702 such as a dummy silicon wafer, a tape, an organic carrier, a metal sheet, or other structural material can protect and provide structural integrity to the integrated circuit package system 100 during manufacturing. The stack provisional carrier 702 can be removed during further processing.

The base ball-end 110 and the stack ball-end 128 can be compressed or coined to form an interconnect surface such as a pad. Optionally, an insulating layer (not shown) can be formed over the base back side 118.

Figure 8:
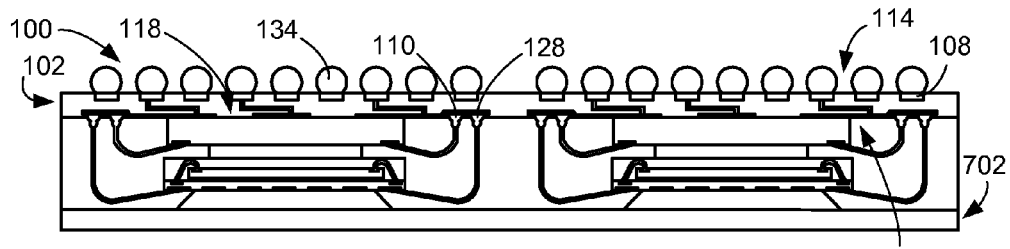
FIG. 8 is the structure of FIG. 7 in a routing phase.

Referring now to FIG. 8, therein is shown the structure of FIG. 7 in a routing phase. The integrated circuit package system 100 preferably includes the redistribution network 102 formed over the base ball-end 110, the stack ball-end 128, the base device 104, and the encapsulant 130.

One or more of the re-routing films 108 can be formed by thin film technology to form the redistribution network 102 over the base back side 118 of the base device 104. The internal side 112 of the redistribution network 102 can provide the re-routing recess 202 for the base ball-end 110.

The package connectors 134 can be attached to the external side 114 of the redistribution network 102. The re-routing films 108 of the external side 114 provide electrical connectivity to the package connectors 134 and thereby electrical connectivity to a next level system such as another package, a printed circuit board, or any other component.

Figure 9:
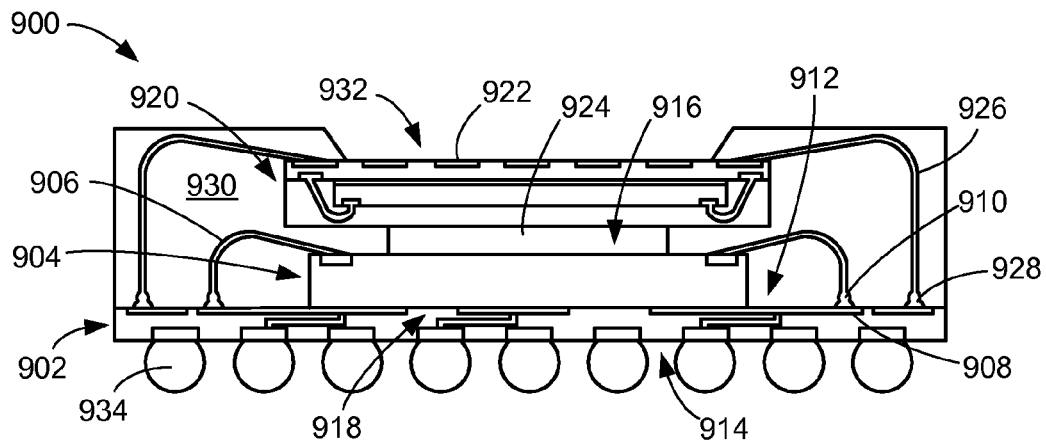
FIG. 9 is a cross-sectional view of an integrated circuit package system taken along line 9-9 of FIG. 11 in a second embodiment of the present invention.
Figure 11:
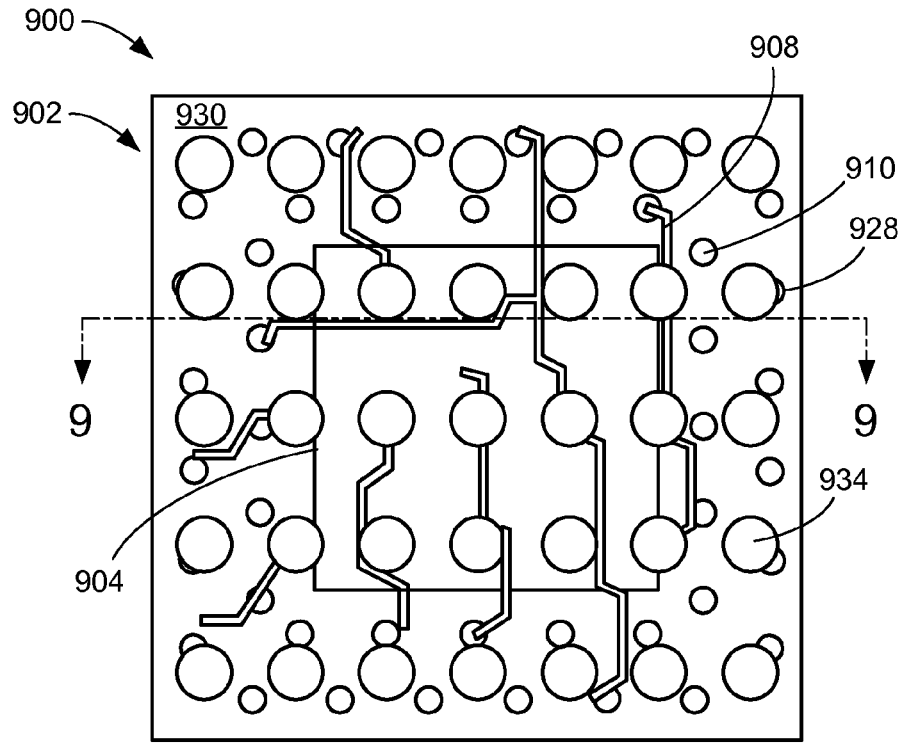
FIG. 11 is a bottom plan view of the integrated circuit package system.

Referring now to FIG. 9, therein is shown a cross-sectional view of an integrated circuit package system 900 taken along line 9-9 of FIG. 11 in a second embodiment of the present invention. The integrated circuit package system 900 preferably includes a redistribution network 902, a base device 904, and base interconnects 906.

The redistribution network 902 can be formed of one or more re-routing films 908 such as thin film conductors including integrated passive devices (IPD), or redistribution layers (RDL). The re-routing films 908 can be formed in a range of a few micrometers and provide an internal side 912 and an external side 914 of the redistribution network 902.

The base interconnects 906 such as wire bonds, planar interconnect, bumps, or any conductive material with any connection technology can include a base ball-end 910. The base ball-end 910 can be formed over the internal side 912 of the redistribution network 902 electrically connecting one of the re-routing films 908 to a base front side 916 of the base device 904.

For illustrative purposes, the base ball-end 910 is shown as a compressed or coined ball although it is understood that the base ball-end 910 can be formed differently. For example, the base ball-end 910 can be formed having a side substantially planar to a base back side 918 of the base device 904.

The base back side 918 can provide an attachment surface for the redistribution network 902. The base device 904 such as an integrated circuit die, an integrated circuit package, an internal stacking module, an interposer, or any other device can be attached over the redistribution network 902.

A stack device 920 such as an integrated circuit die, an integrated circuit package, an internal stacking module, an interposer, or any other device can be mounted over the base device 904. The stack device 920 having stack connectors 922 can be mounted with an attach layer 924 such as a silicon spacer, film, or wire in film material.

Stack interconnects 926 such as wire bonds, planar interconnect, bumps, or any conductive material with any connection technology can include a stack ball-end 928. The stack ball-end 928 can be formed over the internal side 912 of the redistribution network 902 electrically connecting one of the re-routing films 908 to the stack device 920.

An encapsulant 930 can cover and protect the stack interconnects 926, the stack device 920, the attach layer 924, the base interconnects 906, or the base device 904. The encapsulant 930 can optionally include an encapsulant cavity 932 such as fan-in cavity for a package on package or other component. The encapsulant cavity 932 can provide a portion of the stack device 920 including a portion of the stack connectors 922 substantially exposed.

Package connectors 934 can be formed on a side opposite the base device 904 over the external side 914 of the redistribution network 902. The package connectors 934 can provide electrical connectivity to a next level system such as another package, a printed circuit board, or any other component.

Figure 10:
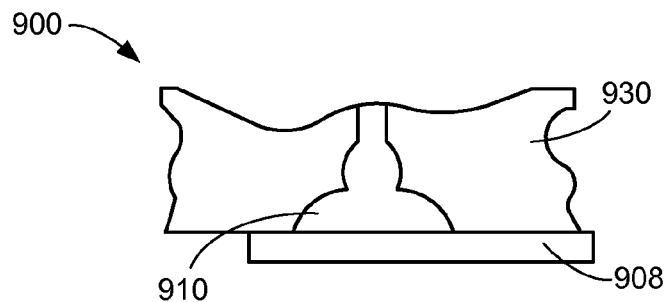
FIG. 10 is a detailed view of a portion of the structure of FIG. 9.

Referring now to FIG. 10, therein is shown a detailed view of a portion of the structure of FIG. 9. The base ball-end 910 is shown as a compressed or coined ball having a side substantially planar to the base back side 918 of FIG. 9.

The re-routing films 908 can include a region for electrical connectivity of the base ball-end 910 or the stack ball-end 928 that can be formed substantially planar to the base back side 918.

Referring now to FIG. 11, therein is shown a bottom plan view of the integrated circuit package system 900. The integrated circuit package system 900 preferably includes the package connectors 934, the base ball-end 910, the stack ball-end 928, the re-routing films 908, and the encapsulant 930.

The redistribution network 902 with the re-routing films 908 provides interconnection of the base device 904 of FIG. 9, the stack device 920 of FIG. 9, and a next level system without the need for a conventional substrate.

Figure 12:
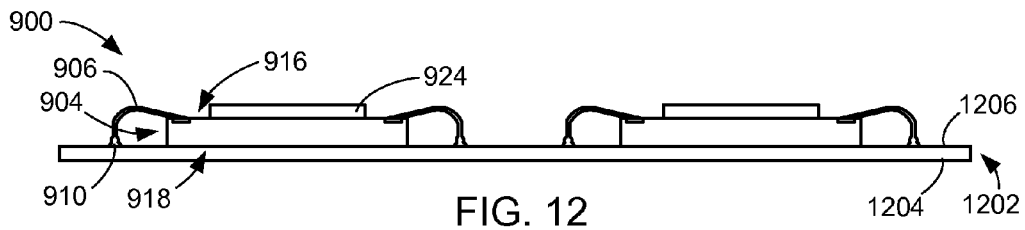
FIG. 12 is a cross-section view of the integrated circuit package system in a device attaching phase.

Referring now to FIG. 12, therein is shown a cross-section view of the integrated circuit package system 900 in a device attaching phase. The integrated circuit package system 900 preferably includes the base device 904 attached over a base provisional carrier 1202 that can be removed during further processing.

The base provisional carrier 1202 includes a support side 1204 and a mounting side 1206. The base interconnects 906 can be connected to the base front side 916 of the base device 904 and the base ball-end 910 can be over the support side 1204 and embedded in the mounting side 1206.

The base ball-end 910 can be formed substantially planar to a plane of the base back side 918 of the base device 904 on a side opposite the attach layer 924 applied over the base front side 916 for attaching another device.

For illustrative purposes, two of the base device 904 are shown although it is understood that any number of the base device 904 may be used. An array of the base device 904 can be formed during processing for volume manufacturing.

Figure 13:
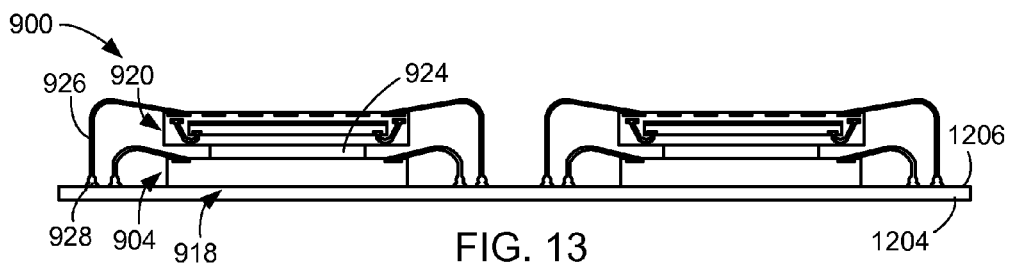
FIG. 13 is the structure of FIG. 12 in another device attaching phase.

Referring now to FIG. 13, therein is shown the structure of FIG. 12 in another device attaching phase. The integrated circuit package system 900 preferably includes the stack device 920 over the attach layer 924 and the base device 904.

The stack interconnects 926 can be connected to the stack device 920 and the stack ball-end 928 can be over the mounting side 1206. The stack ball-end 928 can be formed substantially planar to a plane of the base back side 918 of the base device 904.

Figure 14:
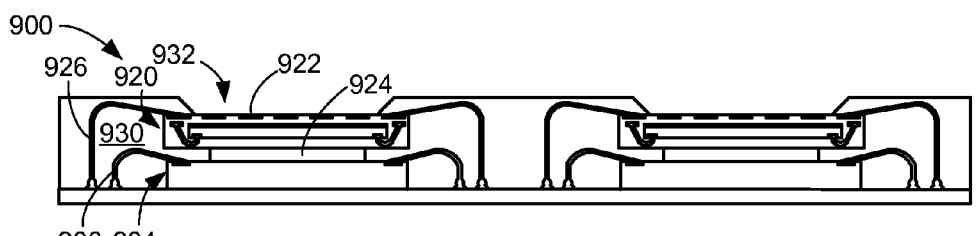
FIG. 14 is the structure of FIG. 13 in an encapsulation phase.

Referring now to FIG. 14, therein is shown the structure of FIG. 13 in an encapsulation phase. The integrated circuit package system 900 preferably includes the encapsulant 930 over the stack interconnects 926, the stack device 920, the attach layer 924, the base interconnects 906, and the base device 904.

The encapsulant 930 can optionally include the encapsulant cavity 932 providing a portion of the stack device 920 including a portion of the stack connectors 922 substantially exposed for a package on package or other component.

Figure 15:
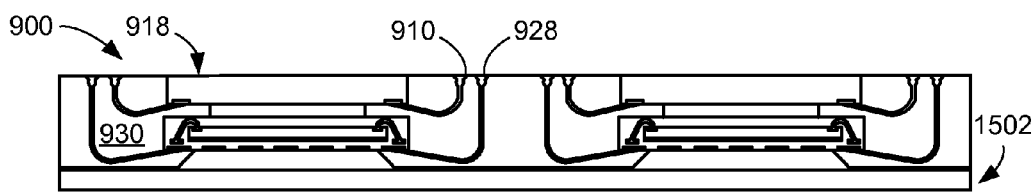
FIG. 15 is the structure of FIG. 14 in another carrier phase.

Referring now to FIG. 15, therein is shown the structure of FIG. 14 in another carrier phase. The integrated circuit package system 900 preferably includes a stack provisional carrier 1502 over the encapsulation on a side opposite the base provisional carrier 1202 of FIG. 12.

The stack provisional carrier 1502 such as a dummy silicon wafer, a tape, an organic carrier, a metal sheet, or other structural material can protect and provide structural integrity to the integrated circuit package system 900 during manufacturing. The stack provisional carrier 1502 can be removed during further processing.

The base ball-end 910 and the stack ball-end 928 can be compressed or coined to form an interconnect surface such as a pad. Optionally, an insulating layer (not shown) can be formed over the base back side 918.

Figure 16:
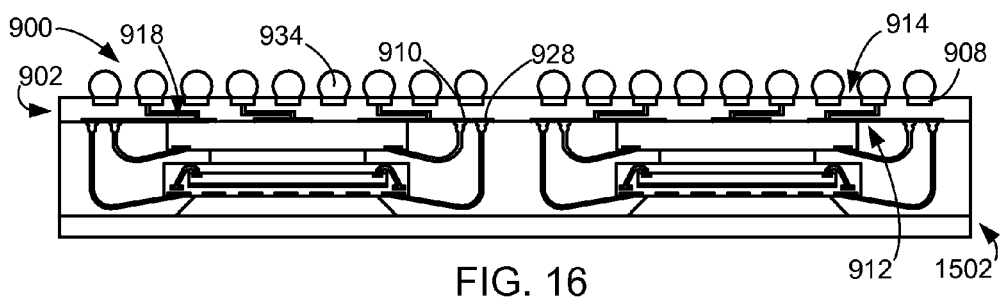
FIG. 16 is the structure of FIG. 15 in a routing phase.

Referring now to FIG. 16, therein is shown the structure of FIG. 15 in a routing phase. The integrated circuit package system 900 preferably includes the redistribution network 902 formed over the base ball-end 910, the stack ball-end 928, the base device 904, and the encapsulant 930.

One or more of the re-routing films 908 can be formed by thin film technology to form the redistribution network 902 over the base back side 918 of the base device 904. The internal side 912 of the redistribution network 902 can provide a connection surface for the base ball-end 910.

The package connectors 934 can be attached to the external side 914 of the redistribution network 902. The re-routing films 908 of the external side 914 provide electrical connectivity to the package connectors 934 and thereby electrical connectivity to a next level system such as another package, a printed circuit board, or any other component.

Figure 17:
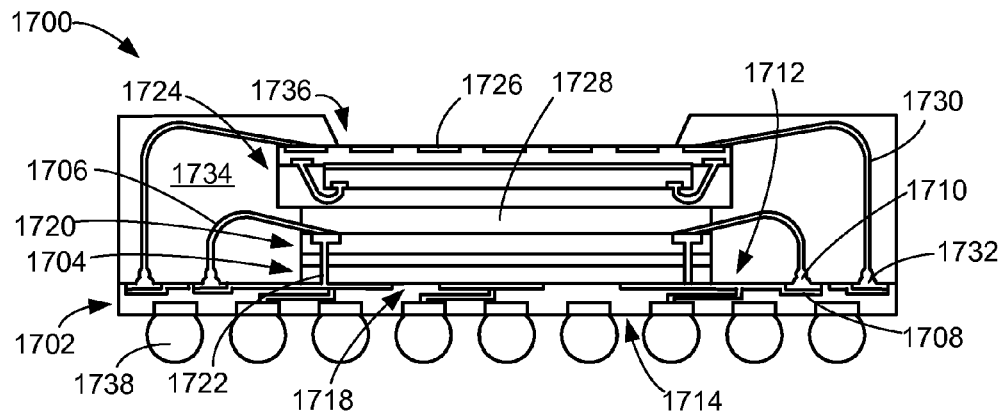
FIG. 17 is a cross-sectional view of an integrated circuit package system in a third embodiment of the present invention.

Referring now to FIG. 17, therein is shown a cross-sectional view of an integrated circuit package system 1700 in a third embodiment of the present invention. The integrated circuit package system 1700 preferably includes a redistribution network 1702, a base device 1704, and base interconnects 1706.

The redistribution network 1702 can be formed of one or more re-routing films 1708 such as thin film conductors including integrated passive devices (IPD), or redistribution layers (RDL). The re-routing films 1708 can be formed in a range of a few micrometers and provide an internal side 1712 and an external side 1714 of the redistribution network 1702.

The base interconnects 1706 such as wire bonds, planar interconnect, bumps, or any conductive material with any connection technology can include a base ball-end 1710. The base ball-end 1710 can be formed over the internal side 1712 of the redistribution network 1702 electrically connecting one of the re-routing films 1708 to components.

For illustrative purposes, the base ball-end 1710 is shown as a compressed or coined ball although it is understood that the base ball-end 1710 can be formed differently. For example, the base ball-end 1710 can be formed having a portion extending beyond a plane of a base back side 1718 of the base device 1704.

The base back side 1718 can provide an attachment surface for the redistribution network 1702. The base device 1704 such as a through-silicon-via die or any other device can be attached over the redistribution network 1702.

A base stack device 1720 such as a through-silicon-via die can be attached over the base device 1704. The base stack device 1720 can be electrically connected with a through-silicon-via connector 1722. The through-silicon-via connector 1722 can be formed through the base device 1704.

The redistribution network 1702 can provide improved package thickness resulting in a reduction of two tenths of a millimeter or more. The redistribution network 1702 can replace a substrate (not shown) having a thickness of more than two tenths of a millimeter and providing spacing for two or more through-silicon-via devices such as the base device 1704 and the base stack device 1720.

A stack device 1724 such as an integrated circuit die, an integrated circuit package, an internal stacking module, an interposer, or any other device can be mounted over the base device 1704. The stack device 1724 having stack connectors 1726 can be mounted with an attach layer 1728 such as a wire in film material. The base interconnects 1706 can be formed partially within the attach layer 1728.

Stack interconnects 1730 such as wire bonds, planar interconnect, bumps, or any conductive material with any connection technology can include a stack ball-end 1732. The stack ball-end 1732 can be formed over the internal side 1712 of the redistribution network 1702 electrically connecting one of the re-routing films 1708 to the stack device 1724.

An encapsulant 1734 can cover and protect the stack interconnects 1730, the stack device 1724, the attach layer 1728, the base interconnects 1706, or the base device 1704. The encapsulant 1734 can optionally include an encapsulant cavity 1736 such as fan-in cavity for a package on package or other component. The encapsulant cavity 1736 can provide a portion of the stack device 1724 including a portion of the stack connectors 1726 substantially exposed.

Package connectors 1738 can be formed on a side opposite the base device 1704 over the external side 1714 of the redistribution network 1702. The package connectors 1738 can provide electrical connectivity to a next level system such as another package, a printed circuit board, or any other component.

Figure 18:
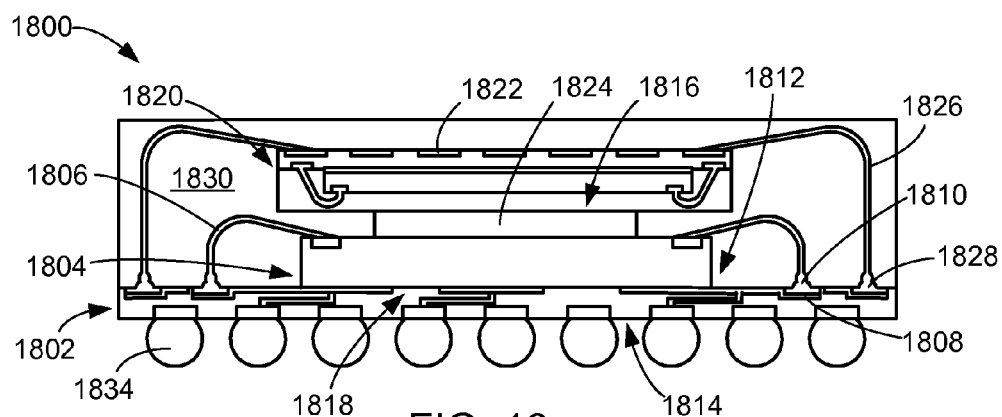
FIG. 18 is a cross-sectional view of an integrated circuit package system taken along line 18-18 of FIG. 20 in a fourth embodiment of the present invention.
Figure 20:
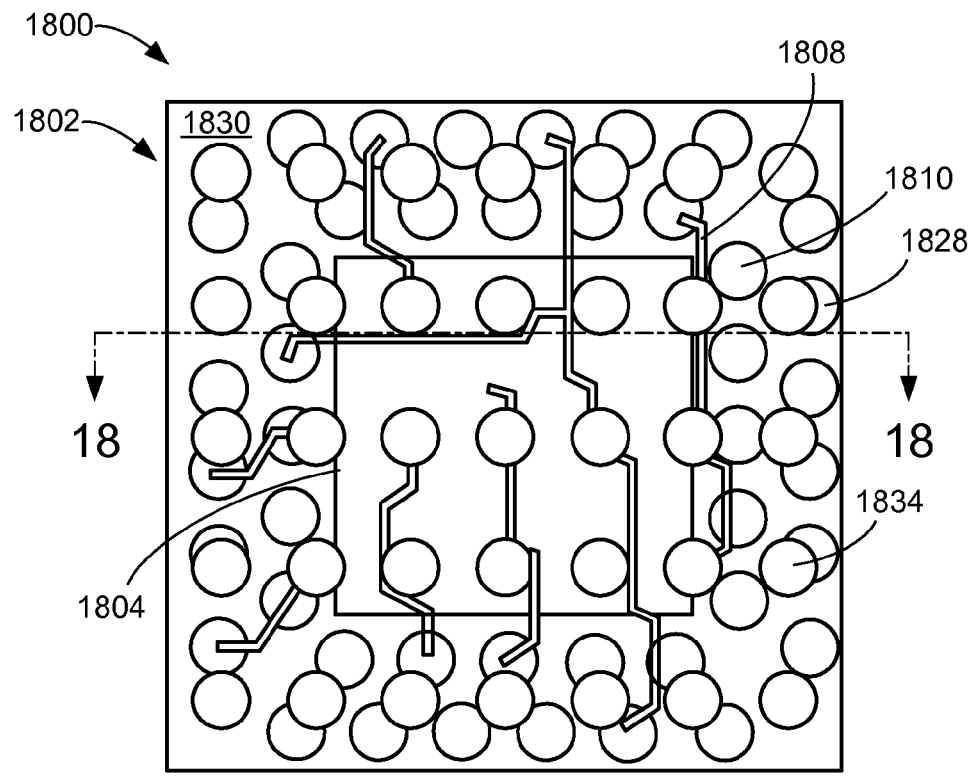
FIG. 20 is a bottom plan view of the integrated circuit package system.

Referring now to FIG. 18, therein is shown a cross-sectional view of an integrated circuit package system 1800 taken along line 18-18 of FIG. 20 in a fourth embodiment of the present invention. The integrated circuit package system 1800 preferably includes a redistribution network 1802, a base device 1804, and base interconnects 1806.

The redistribution network 1802 can be formed of one or more re-routing films 1808 such as thin film conductors including integrated passive devices (IPD), or redistribution layers (RDL). The re-routing films 1808 can be formed in a range of a few micrometers and provide an internal side 1812 and an external side 1814 of the redistribution network 1802.

The base interconnects 1806 such as wire bonds, planar interconnect, bumps, or any conductive material with any connection technology can include a base ball-end 1810. The base ball-end 1810 can be formed over the internal side 1812 of the redistribution network 1802 electrically connecting one of the re-routing films 1808 to a base front side 1816 of the base device 1804.

For illustrative purposes, the base ball-end 1810 is shown as a compressed or coined ball although it is understood that the base ball-end 1810 can be formed differently. For example, the base ball-end 1810 can be formed having a portion extending beyond a plane of a base back side 1818 of the base device 1804.

The base back side 1818 can provide an attachment surface for the redistribution network 1802. The base device 1804 such as a pre-tested integrated circuit die, integrated circuit package, internal stacking module, interposer, or component can be attached over the redistribution network 1802.

A stack device 1820 such as a pre-tested integrated circuit die, integrated circuit package, internal stacking module, interposer, or component can be mounted over the base device 1804. The stack device 1820 having stack connectors 1822 can be mounted with an attach layer 1824 such as a silicon spacer, film, or wire in film material.

Stack interconnects 1826 such as wire bonds, planar interconnect, bumps, or any conductive material with any connection technology can include a stack ball-end 1828. The stack ball-end 1828 can be formed over the internal side 1812 of the redistribution network 1802 electrically connecting one of the re-routing films 1808 to the stack device 1820.

An encapsulant 1830 can cover and protect the stack interconnects 1826, the stack device 1820, the attach layer 1824, the base interconnects 1806, or the base device 1804. The encapsulant 1830 can.

Package connectors 1834 can be formed on a side opposite the base device 1804 over the external side 1814 of the redistribution network 1802. The package connectors 1834 can provide electrical connectivity to a next level system such as another package, a printed circuit board, or any other component.

Figure 19:
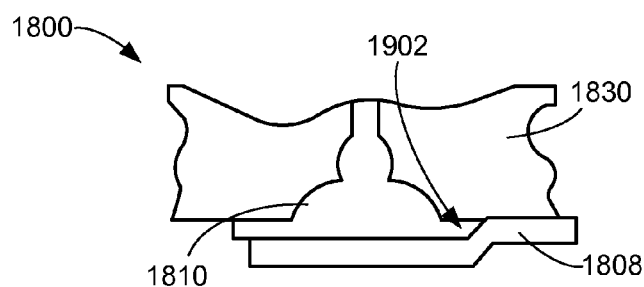
FIG. 19 is a detailed view of a portion of the structure of FIG. 18.

Referring now to FIG. 19, therein is shown a detailed view of a portion of the structure of FIG. 18. The base ball-end 1810 is shown as a compressed or coined ball having a portion extending beyond a plane of the base back side 1818 of FIG. 18.

The re-routing films 1808 can include a re-routing recess 1902 for the portion of the base ball-end 1810 or the stack ball-end 1828 extending beyond a plane of the base back side 1818.

Referring now to FIG. 20, therein is shown a bottom plan view of the integrated circuit package system 1800. The integrated circuit package system 1800 preferably includes the package connectors 1834, the base ball-end 1810, the stack ball-end 1828, the re-routing films 1808, and the encapsulant 1830.

The redistribution network 1802 with the re-routing films 1808 provides interconnection of the base device 1804 of FIG. 18, the stack device 1820 of FIG. 18, and a next level system without the need for a conventional substrate.

Figure 21:
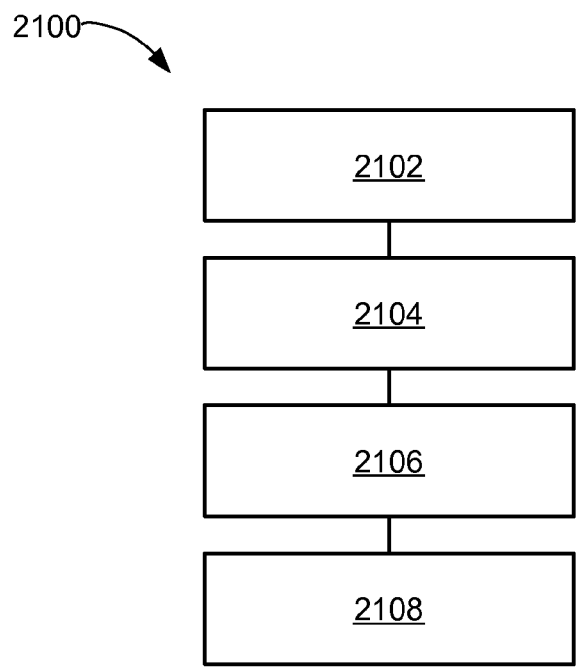
FIG. 21 is a flow chart of an integrated circuit package system for manufacturing the integrated circuit package system in an embodiment of the present invention.

Referring now to FIG. 21, therein is shown a flow chart of an integrated circuit package system 2100 for manufacturing the integrated circuit package system 100 in an embodiment of the present invention. The system 2100 includes providing a base device in a block 2102; attaching a base interconnect to the base device in a block 2104; applying an encapsulant over the base device and the base interconnect in a block 2106; and forming a re-routing film over the encapsulant, the base device, and the base interconnect for connectivity without a substrate in a block 2108.

In greater detail, a system to provide the method and apparatus of the integrated circuit package system 100, in an embodiment of the present invention, is performed as follows:

1. Providing a base device having a base front side and a base back side.
2. Attaching a base interconnect to the base front side and having a base ball-end near the base back side.
3. Applying an encapsulant over the base device and the base interconnect with the base back side and the base ball-end substantially exposed.
4. Forming a re-routing film over the encapsulant, the base device, and the base interconnect for connectivity without a substrate.
5. Attaching a package connector over a side of the re-routing film opposite the base device.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
 providing a base device,
 attaching a base interconnect to the base device, wherein attaching the base interconnect includes forming a base ball-end substantially coplanar to a plane of a base back side of the base device,
 applying an encapsulant over the base device and the base interconnect; and
 forming a re-routing film over the encapsulant, the base device, and the base interconnect for connectivity without a substrate.

2. The method as claimed in claim 1 wherein attaching the base device further includes attaching more than one of a through-silicon-via device.

3. The method as claimed in claim 1 further comprising attaching a stack device over the base device.

4. A method for manufacturing an integrated circuit package system comprising:
 providing a base device having a base front side and a base back side;
 attaching a base interconnect to the base front side and having a base ball-end near the base back side;
 applying an encapsulant over the base device and the base interconnect with the base back side and the base ball-end substantially exposed;
 forming a re-routing film over the encapsulant, the base device, and the base interconnect for connectivity without a substrate; and
 attaching a package connector over a side of the re-routing film opposite the base device.

5. The method as claimed in claim 4 wherein applying the encapsulant includes forming an encapsulant cavity on a side opposite the re-routing film.

6. The method as claimed in claim 4 further comprising applying a wire-in-film material over the base device.

7. The method as claimed in claim 4 further comprising attaching a stack device over the base device wherein a stack connector of the stack device is on a side opposite the base device.

8. The method as claimed in claim 4 further comprising attaching a stack device over the base device wherein the stack device is an integrated circuit package.

9. An integrated circuit package system comprising:
 a base device,
 a base interconnect connected to the base device, wherein the base interconnect includes a base ball-end substantially coplanar to a plane of a base back side of the base device;
 an encapsulant over the base device and the base interconnect; and
 a re-routing film over the encapsulant, the base device, and the base interconnect for connectivity without a substrate.

10. The system as claimed in claim 9 wherein the base device further includes more than one of a through-silicon-via device.

11. The system as claimed in claim 9 further comprising a stack device over the base device.

12. An integrated circuit package system comprising:
 a base device having a base front side and a base back side;
 a base interconnect connected to the base device, wherein the base interconnect is attached to the base front side and having a base ball-end near the base back side;
 an encapsulant over the base device and the base interconnect, wherein the encapsulant is over the base device and the base interconnect with the base back side and the base ball-end substantially exposed;
 a re-routing film over the encapsulant, the base device, and the base interconnect for connectivity without a substrate, wherein the re-routing film is over the encapsulant, the base back side, and the base ball-end for connectivity without a substrate; and
 a package connector is over a side of the re-routing film opposite the base device.

13. The system as claimed in claim 12 wherein the encapsulant includes an encapsulant cavity on a side opposite the re-routing film.

14. The system as claimed in claim 12 further comprising a wire-in-film material over the base device.

15. The system as claimed in claim 12 further comprising a stack device over the base device wherein a stack connector of the stack device is on a side opposite the base device.

16. The system as claimed in claim 12 further comprising a stack device over the base device wherein the stack device is an integrated circuit package.

* * * * *